(12) United States Patent
Zhu et al.

(10) Patent No.: US 8,963,156 B2
(45) Date of Patent: Feb. 24, 2015

(54) SEMICONDUCTOR DEVICES INCLUDING WISX

(71) Applicant: Micron Technology, Inc., Boise, ID (US)

(72) Inventors: Hongbin Zhu, Boise, ID (US); Gordon Haller, Boise, ID (US); Paul D. Long, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/774,599

(22) Filed: Feb. 22, 2013

(65) Prior Publication Data

US 2014/0239303 A1 Aug. 28, 2014

(51) Int. Cl.
*H01L 29/76* (2006.01)
*H01L 31/036* (2006.01)
*H01L 31/112* (2006.01)
*H01L 21/768* (2006.01)
*H01L 23/522* (2006.01)

(52) U.S. Cl.
CPC ...... *H01L 21/76831* (2013.01); *H01L 23/5226* (2013.01)
USPC ............... 257/66; 257/30; 257/365; 438/58; 438/71

(58) Field of Classification Search
USPC ............ 257/30, 59, 66, 365; 438/58, 71, 283
See application file for complete search history.

(56) References Cited

U.S. PATENT DOCUMENTS

| | | | |
|---|---|---|---|
| 5,948,703 A | 9/1999 | Shen | |
| 2004/0102039 A1 | 5/2004 | Lim et al. | |
| 2008/0099850 A1* | 5/2008 | Jeon et al. | 257/365 |
| 2008/0160771 A1 | 7/2008 | Yu et al. | |
| 2008/0202685 A1* | 8/2008 | Fischer et al. | 156/345.27 |
| 2010/0144133 A1 | 6/2010 | Nomura et al. | |

(Continued)

FOREIGN PATENT DOCUMENTS

| | | | |
|---|---|---|---|
| KR | 1020090098681 A | 9/2009 | |
| KR | 1020110003041 A | 1/2011 | |
| KR | 1020130005434 A | 1/2013 | |

OTHER PUBLICATIONS

"International Application Serial No. PCT/US2014/017778, International Search Report mailed May 23, 2014", 3 pgs.

(Continued)

*Primary Examiner* — Phuc Dang
(74) *Attorney, Agent, or Firm* — Schwegman Lundberg & Woessner, P.A.

(57) ABSTRACT

Some embodiments include a semiconductor device having a stack structure including a plurality of alternating tiers of dielectric material and poly-silicon formed on a substrate. Such a semiconductor device may further include at least one opening having a high aspect ratio and extending into the stack structure to a level adjacent the substrate, a first poly-silicon channel formed in a lower portion of the opening adjacent the substrate, a second poly-silicon channel formed in an upper portion of the opening, and WSiX material disposed between the first poly-silicon channel and the second poly-silicon channel in the opening. The WSiX material is adjacent to the substrate, and can be used as an etch-landing layer and a conductive contact to contact both the first poly-silicon channel and the second poly-silicon channel in the opening. Other embodiments include methods of making semiconductor devices.

9 Claims, 4 Drawing Sheets

(56) References Cited

U.S. PATENT DOCUMENTS

| | | |
|---|---|---|
| 2010/0330792 A1 | 12/2010 | Kim |
| 2011/0031550 A1 | 2/2011 | Komori et al. |
| 2011/0070706 A1* | 3/2011 | Kim et al. ............... 438/258 |
| 2011/0101488 A1* | 5/2011 | Kim ............................ 257/506 |

OTHER PUBLICATIONS

"International Application Serial No. PCT/US2014/017778, Written Opinion mailed May 23, 2014", 5 pgs.

* cited by examiner

US 8,963,156 B2

SEMICONDUCTOR DEVICES INCLUDING WISX

BACKGROUND

With the development of the semiconductor industry, three-dimensional (3D) semiconductor devices are widely explored. However, the structures of the 3D semiconductor devices including multiple stacked tiers (e.g., layers) and high aspect ratio openings (e.g., holes) extending into the tiers, as well as the techniques of fabricating such 3D semiconductor devices, present some implementation challenges.

DETAILED DESCRIPTION

In the following detailed description of the embodiments, reference is made to the accompanying drawings which form a part hereof, and in which is shown by way of illustration specific illustrative embodiments in which the embodiments of the invention may be practiced. These embodiments are described in sufficient detail to enable those of ordinary skill in the art to practice the embodiments of the invention, and it is to be understood that other embodiments may be utilized and that logical, mechanical and electrical changes may be made without departing from the scope of the embodiments presented herein.

Recently, 3D semiconductor devices (e.g., 3D NAND memory devices) have come into use due to severe scaling challenges. However, 3D semiconductor devices that include stacked tiers and high aspect ratio openings extending into the stacked tiers impose challenges to both the structures of the 3D semiconductor devices and the techniques of forming the 3D semiconductor devices.

One problem with the formation of the 3D semiconductor devices is to control etch-landing. When fabricating the 3D semiconductor device, a material (e.g., a film) which is used as an etch-landing layer in the stacked tiers may fail to effectively stop further etching. The etch-landing layer may be too easily etched through (e.g., by an in-situ etch). On the other hand, the etch-landing layer may be too difficult to remove after the etching process, and thus may adversely impact the formation of a contact (e.g., a plug). Additionally, the etch-landing layer may become a barrier, which may obstruct a conductive contact between e.g., poly channels in the 3D semiconductor device.

The term "horizontal" as used in this document is defined as a plane parallel to the conventional plane or surface of a substrate, such as wafer or die, regardless of the orientation of the substrate. The term "vertical" refers to a direction perpendicular to the horizontal as defined above. Prepositions, such as "on", "over" and "under" are defined with respect to the conventional plane or surface being on the top surface of the substrate, regardless of the orientation of the substrate.

In the embodiments described herein, "tungsten and tungsten silicide" (WSiX) material may be used as an etch-landing layer for the formation of a 3D semiconductor device. The 3D semiconductor device may include stacked multiple alternating tiers of dielectric material (e.g., an oxide) and conductive material (e.g., conductively doped poly-silicon) and high aspect ratio openings extending into the stacked multiple alternating tiers. The WSiX material may also be used as a conductive contact (e.g., a conductive plug) to provide an electrical contact between poly-silicon channels within the stacked multiple alternating tiers.

Figure 1:
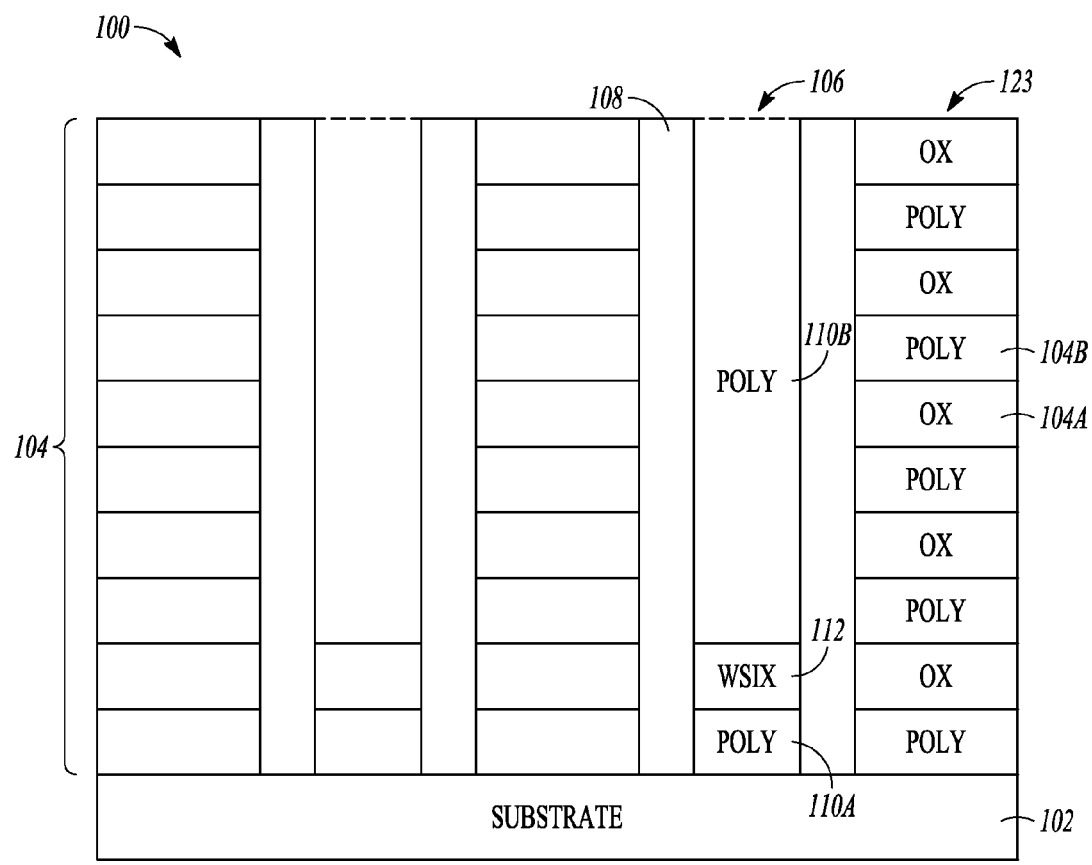
FIG. 1 is a cross-sectional view illustrating a portion of a 3D semiconductor device according to an embodiment of the invention.

FIG. 1 illustrates a portion of a semiconductor device 100 formed over (e.g., on) a substrate 102 according to an embodiment of the invention.

The semiconductor device 100 includes a stack structure 104 formed over the substrate 102. The stack structure 104 includes a plurality of alternating horizontal tiers (e.g., tiers) of dielectric material 104A and poly-silicon 104B. In some embodiments, the dielectric material 104A may include e.g., silicon oxide or tetraethyl orthosilicate (TEOS).

The semiconductor device 100 also includes at least one vertical opening (e.g., an opening 106), which extends into the stack structure 104 to a level adjacent to the substrate 102. The opening 106 may be in a pillar shape, and have a high aspect ratio. An aspect ratio of an opening is defined as a ratio of a depth of the opening to a diameter of the opening. For example, the depth (e.g., the length) of the opening 106 may be about 2 μm, and the diameter of the opening 106 may be about 60-100 nm. In some embodiments, the opening 106 may have an isolation liner 108 formed (e.g., deposited) on an inside wall of the opening 106. Therefore, the high aspect ratio of the opening may be e.g., between about 20 and 33. In some embodiments, the isolation liner 108 may include oxide material or nitride material.

The semiconductor device 100 further includes a first poly-silicon channel 110A formed in a lower portion of the opening 106 adjacent to the substrate 102, a second poly-silicon channel 110B formed in an upper portion of the opening 106, and WSiX material 112 formed between the first poly-silicon channel 110A and the second poly-silicon channel 110B in the opening 106.

The WSiX material 112 may be formed (e.g., by a deposition process) deeply (e.g., to a depth greater than 2 microns) in the opening 106. The WSiX material 112 that is adjacent to the channel 110A may function as an etch-landing layer to stop further etch during a process of forming the device 100, and may also function as a conductive contact to provide an electrical contact between the first poly-silicon channel 110A and the second poly-silicon channel 110B in the opening 106 when the device 100 is operating.

In some embodiments, the stack structure 104 may include a nitride material 123 adjacent to a top surface of the stack structure 104. The top surface of the stack structure 104 is located opposite a bottom surface of the stack structure 104, where the bottom surface of the stack structure 104 is proximate to the substrate 102.

In some embodiments, the semiconductor device 100 as described above may be a memory device. For example, a memory device may comprise a substrate and a stack structure formed on the substrate. The stack structure may include a plurality of alternating tiers of dielectric material and poly-silicon. The semiconductor device may also comprise at least one opening extending into the stack structure to a level adjacent the substrate. The opening may include a first poly-silicon channel formed in a lower portion of the opening adjacent the substrate, a second poly-silicon channel formed in an upper portion of the opening, and WSiX material disposed between the first poly-silicon channel and the second poly-silicon channel in the opening, as a conductive contact, to contact both the first poly-silicon channel and the second poly-silicon channel in the opening.

FIGS. 2A-2F are cross-sectional views illustrating an example of a technique of making a semiconductor device 200 according to an embodiment of the invention.

Figure 2A:
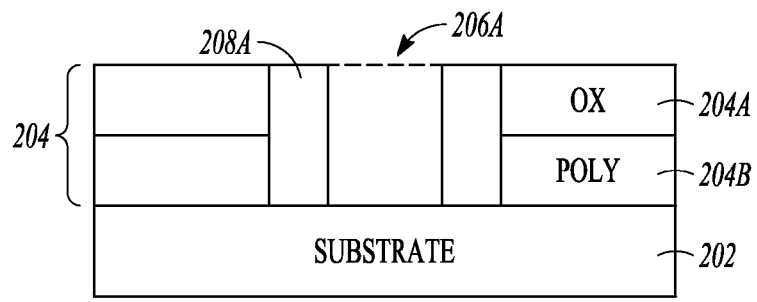
FIGS. 2A-2F are cross-sectional views illustrating an example of a technique of making a 3D semiconductor device according to an embodiment of the invention.

Initially referring to FIG. 2A, a first stack structure 204 is formed on a substrate 202. The first stack structure 204 may include a first plurality of alternating tiers of dielectric material 204A and poly-silicon 204B, the alternating tiers extending horizontally over the substrate 202. In some embodiments, the dielectric material 204A may include e.g., silicon oxide or TEOS.

At least one first opening 206A is formed (e.g., by wet or dry etching) vertically into the first stack structure 200A to a level which is adjacent to the substrate 202.

Prior to filling the first opening 206A, a first isolation liner 208 may be formed on an inside wall of the first opening 206A. In some embodiments, the first isolation liner 208 may include oxide material or nitride material.

A first poly-silicon channel 210A may be formed in the first opening 206A by depositing poly-silicon in the first poly-silicon channel 210A. In some embodiments, the first poly-silicon channel 210A may be formed in the first opening 206A by using poly-silicon to at least partially fill the first opening 206A.

Figure 2B:
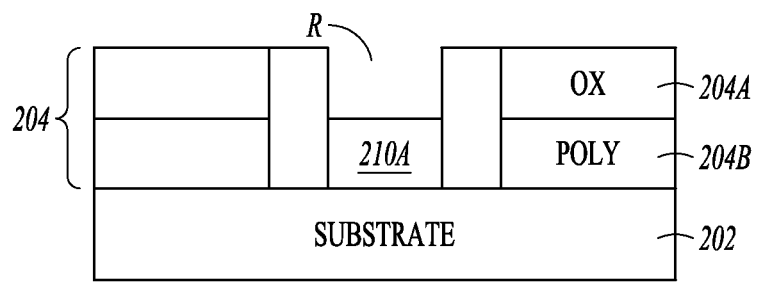

Referring to FIG. 2B, an upper portion of the first poly-silicon channel 210A in the first opening 206A is removed (e.g., by a wet or dry etching process) to form a recess "R".

Figure 2C:
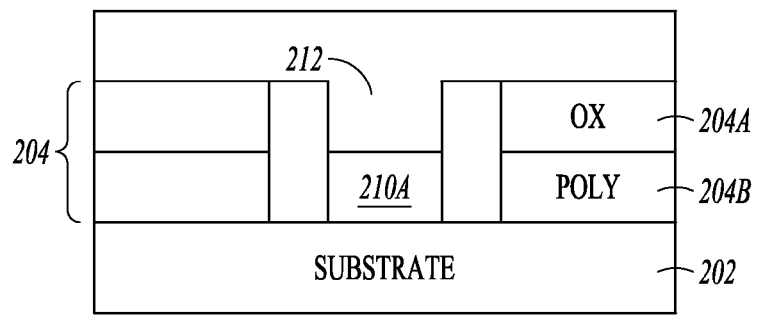

Referring to FIG. 2C, WSiX material 212 is deposited on a top surface of the first stack structure 204, to at least partially fill the recess "R".

Figure 2D:
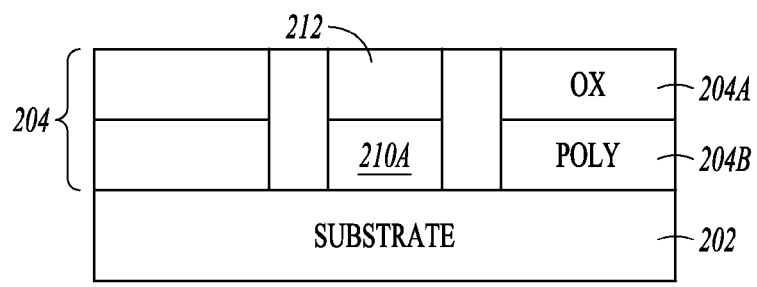

Referring to FIG. 2D, a portion of the WSiX material 212 deposited on the top surface of the first structure 204 is removed e.g., by a chemical mechanical planarization (CMP) process, and thus a portion of the WSiX material 212 filled into the recess "R" is exposed.

Figure 2E:
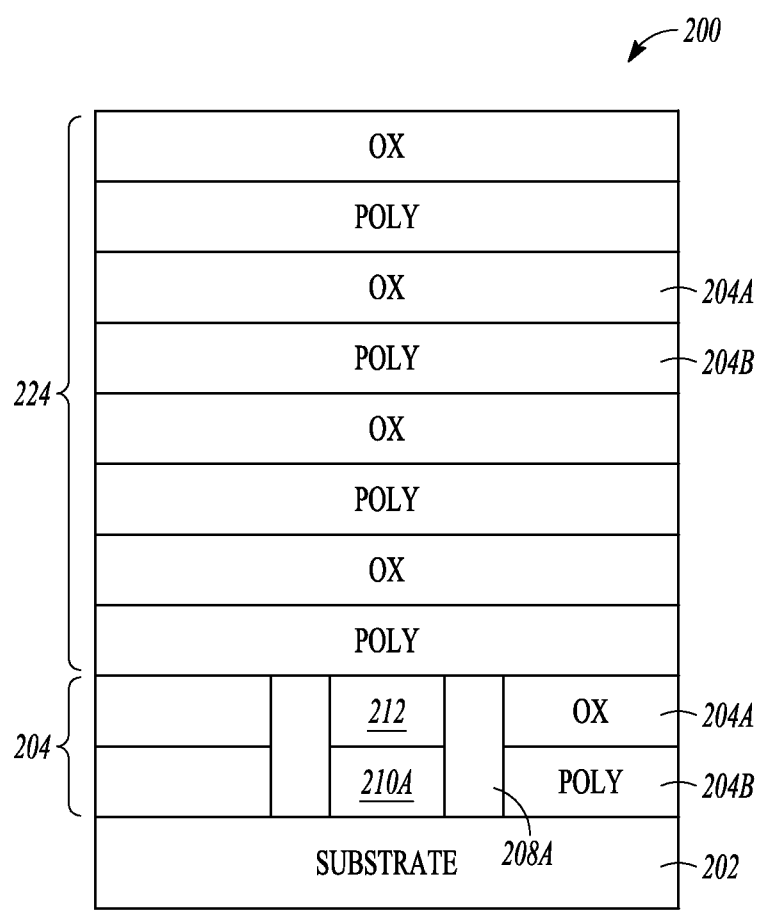

Referring to FIG. 2E, a second stack structure 224 is formed on the top surface of the first stack structure 204 and the exposed portion of the WSiX material 212. The second stack structure 224 includes a second plurality of alternating tiers of dielectric material (e.g., silicon oxide or TEOS) 204A and poly-silicon 204B.

Figure 2F:
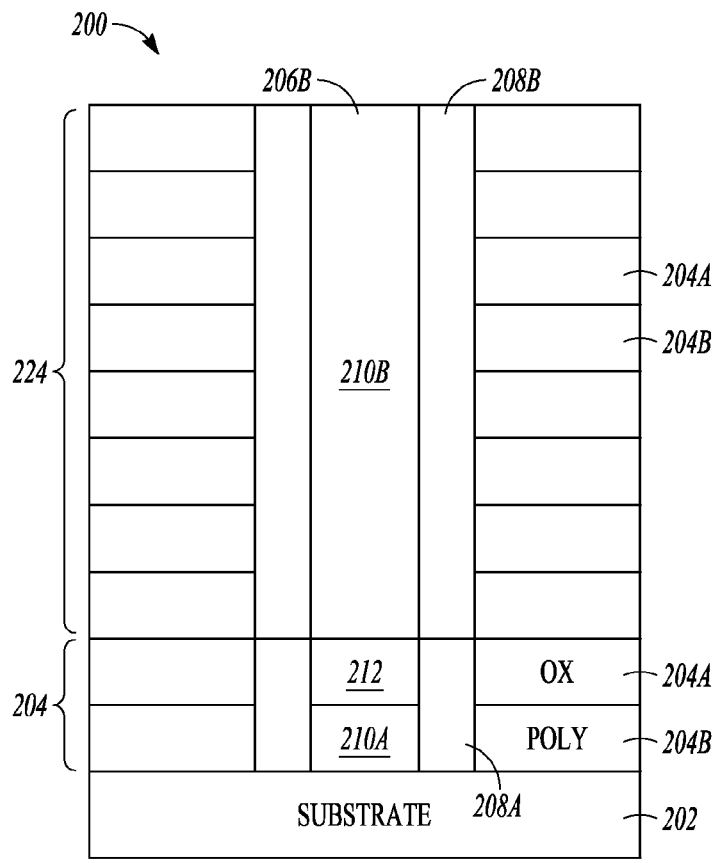

Referring to FIG. 2F, at least one second opening 206B is etched (e.g., by a wet or dry etching process) into the second stack structure 224 to expose a portion of the WSiX material 212 formed in the first opening 206A (as shown in FIG. 2A) of the first stack structure 204. The second opening 206B may have a pillar shape. The second opening 206B may have a high aspect ratio. For example, the second opening 206B may have a depth greater than 2 microns, and a diameter less than 70 nanometers.

A second isolation liner 208B may be formed on an inside wall of the second opening 206B, prior to filling the second opening 206B. In some embodiments, the second isolation liner 208B may include oxide material or nitride material.

After that, poly-silicon is deposited into the second opening 206B to form a second poly-silicon channel 210B. The second opening 206B thus is in contact with the WSiX material 212. In some embodiments, poly-silicon is used to at least partially fill the second opening 206B to form the second poly-silicon channel 210B.

Therefore, the WSiX material 212 is deeply embedded into the second opening 206B and on top of the first poly-silicon channel 210A, and may electrically contact both the first poly-silicon channel 210A and the second poly-silicon channel 210B during the operation of the 3D semiconductor device 200. During the process of making the 3D semiconductor device 200, the WSiX material 212 may function as an etch-landing layer to control (e.g., to stop) further etching into the first poly-silicon channel 210A, and thus also to prevent further etching into the substrate 202 that is under and adjacent to the first poly-silicon channel 210A.

Figure 3:
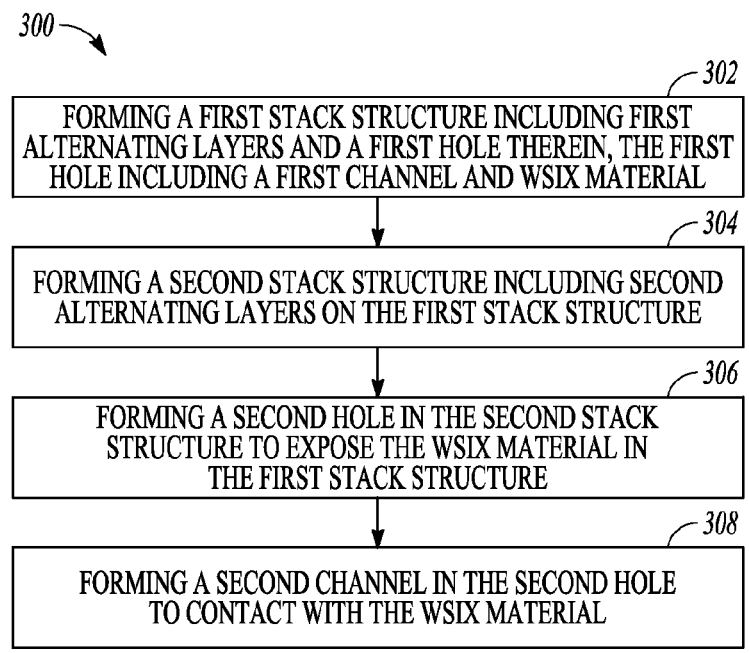
FIG. 3 is a flow chart illustrating a process of making a 3D semiconductor device according to an embodiment of the invention.

FIG. 3 is a flow diagram illustrating a method 300 of making a semiconductor device according to an embodiment of the invention.

Referring now to FIGS. 2A-2D and 3, it can be seen that at 302, a first stack structure 204 is formed on a substrate 202. The first structure 204 includes a first plurality of alternating tiers of dielectric material 204A and poly-silicon 204B.

The first stack structure 204 also includes at least one first opening 206A that extends to a level adjacent the substrate 202. The at least one first opening 206A may be formed e.g., by a wet or dry etching process.

The at least one first opening 206A includes a first poly-silicon channel 210A that may be formed by depositing poly-silicon within a lower portion of the first opening 206A. The at least one first opening 206A also includes WSiX material 212, that may be formed by depositing WSiX within an upper portion of the first opening 206A. The WSiX material 212 thus contacts the first poly-silicon channel 210A.

In some embodiments, the at least one first opening 206A may include a first isolation liner 208A, which is formed e.g., by an In Situ Steam Generation (ISSG) process on an inside wall of the first opening 206A. In one embodiment, the first isolation liner 208A is formed by a High Temperature Oxide (HTO) process. For example, the HTO is formed by low pressure chemical vapor deposition (LPCVD) using nitrous oxide ($N_2O$) and dichlorosilane ($SiH_2Cl_2$) gasses at a temperature of about 600 degrees Celsius or more and about 900 degrees Celsius or less and a pressure of about 100 mTorr or more and about 500 mTorr or less.

At 304, a second stack structure 224 is formed on the first stack structure 204, and on the WSiX material 212, which is deposited into an upper portion of the first opening 206A in the first stack structure 204. Also referring to FIG. 2E, the second stack structure 224 includes a second plurality of alternating tiers of dielectric material 204A and poly-silicon 204B.

At 306, at least one second opening 206B is formed in the second stack structure 224 to expose a portion of the WSiX material 212 deposited into the at least one first opening 206A of the first stack structure 204. (Also referring to FIG. 2F). The at least one second opening 206B may be formed e.g., by a wet or dry etching process.

At 308, a second poly-silicon channel 210B is formed by depositing poly-silicon in the second opening 206B, and the second poly-silicon channel 210B is thus placed in contact with the WSiX material 212. In some embodiments, the second poly-silicon channel 210B is formed by at least partially filling the second opening 206B with poly-silicon. In some embodiments, prior to depositing poly-silicon into the second opening 206B to form the second poly-silicon channel 210B, a second isolation liner 208 is formed by an ISSG process on an inside wall of the second opening 206B.

Therefore, the WSiX material 212 is in electrical contact with both the first poly-silicon channel 210A and the second poly-silicon channel 210B, and may function as an etch-landing layer to stop further etching during the process of manufacturing the semiconductor device 100.

While a number of embodiments are described herein, these are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the disclosure. It is to be understood that the above description is intended to be illustrative and not restrictive. Combinations of the above embodiments, and other embodiments, will be apparent to those of skill in the art upon studying the above description.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A semiconductor device, comprising:
a stack structure over a substrate, the stack structure including a plurality of alternating tiers of dielectric material and conductive material;
an opening extending into the stack structure to a level adjacent the substrate;
a first poly-silicon channel in a lower portion of the opening adjacent the substrate, and a second poly-silicon channel in an upper portion of the opening; and
WSiX material between and in contact with the first poly-silicon channel and the second poly-silicon channel in the opening, and completely separating the first poly-silicon channel and the second poly-silicon channel.

2. The semiconductor device of claim 1, wherein the dielectric material comprises tetraethyl ortho silicate (TEOS).

3. The semiconductor device of claim 1, wherein the dielectric material comprises silicon oxide.

4. The semiconductor device of claim 1, wherein the opening has a high aspect ratio.

5. The semiconductor device of claim 1, further including an isolation liner on an inside wall of the opening.

6. The semiconductor device of claim 5, wherein the isolation liner comprises oxide material.

7. The semiconductor device of claim 5, wherein the isolation liner comprises nitride material.

8. A semiconductor device, comprising:
a stack structure over a substrate, the stack structure including a plurality of alternating tiers of dielectric material and conductive material;
an opening extending into the stack structure to a level adjacent the substrate;
a first poly-silicon channel in a lower portion of the opening adjacent the substrate, and a second poly-silicon channel in an upper portion of the opening; and
WSiX material between and in contact with the first poly-silicon channel and the second poly-silicon channel in the opening, wherein the stack structure includes a nitride material adjacent a top surface of the stack structure, the top surface located opposite a bottom surface of the stack structure proximate to the substrate.

9. A memory device, comprising:
a substrate; and
a stack structure over the substrate, the stack structure including a plurality of alternating tiers of dielectric material and poly-silicon, and an opening extending into the stack structure to a level adjacent the substrate, the opening including a first poly-silicon channel formed in a lower portion of the opening adjacent the substrate, and a second poly-silicon channel formed in an upper portion of the opening,
wherein the opening further includes WSiX material between and in contact with the first poly-silicon channel and the second poly-silicon channel in the opening, and completely separating the first poly-silicon channel and the second poly-silicon channel.

* * * * *